United States Patent [19]

Maue et al.

[11] Patent Number: 5,785,532
[45] Date of Patent: Jul. 28, 1998

[54] POWER DISTRIBUTION BOX AND SYSTEM

[75] Inventors: H. Winston Maue, Farmington Hills; Mohamad H. Zeiden, Dearborn, both of Mich.; Luke P. Steigerwald, Manlius, N.Y.

[73] Assignee: United Technologies Automotive, Inc., Dearborn, Mich.

[21] Appl. No.: 687,132

[22] Filed: Jul. 24, 1996

Related U.S. Application Data

[63] Continuation of Ser. No. 264,796, Jun. 23, 1994, abandoned, which is a continuation-in-part of Ser. No. 73,899, Jun. 9, 1993, abandoned.

[51] Int. Cl.⁶ .................................................. H01R 9/24
[52] U.S. Cl. ............................................. 439/34; 439/949
[58] Field of Search ............................ 439/34, 76.2, 949

[56] References Cited

U.S. PATENT DOCUMENTS

| | | |
|---|---|---|
| 3,555,497 | 1/1971 | Watanabe . |
| 3,701,071 | 10/1972 | Landman . |
| 3,854,973 | 12/1974 | Mersereau et al. . |
| 3,961,228 | 6/1976 | Briggs et al. . |
| 3,970,802 | 7/1976 | Nijman ................................. 439/77 |
| 4,135,226 | 1/1979 | Kourimsky . |
| 4,208,080 | 6/1980 | Teagno . |
| 4,255,004 | 3/1981 | Kourimsky et al. . |
| 4,290,664 | 9/1981 | Davis et al. ......................... 439/676 |
| 4,355,853 | 10/1982 | Kourimsky . |
| 4,534,025 | 8/1985 | Floyd . |
| 4,577,917 | 3/1986 | Nashimoto et al. . |
| 4,602,834 | 7/1986 | Hahn et al. . |
| 4,603,928 | 8/1986 | Evans . |
| 4,669,793 | 6/1987 | Hayashi et al. ..................... 439/64 |
| 4,689,718 | 8/1987 | Maue et al. . |
| 4,703,397 | 10/1987 | Minoura et al. . |
| 4,707,394 | 11/1987 | Chant . |
| 4,797,508 | 1/1989 | Chant . |
| 4,798,545 | 1/1989 | Roy et al. . |
| 4,850,884 | 7/1989 | Sawai et al. . |
| 4,853,277 | 8/1989 | Chant . |
| 4,861,282 | 8/1989 | Kobayashi et al. ................ 439/559 |
| 4,906,195 | 3/1990 | Kubota et al. . |
| 4,909,756 | 3/1990 | Jervis .................................. 439/521 |
| 4,923,411 | 5/1990 | Hayashi et al. . |
| 4,954,085 | 9/1990 | Inoue .................................. 439/34 |
| 4,997,390 | 3/1991 | Scholz et al. . |
| 5,023,752 | 6/1991 | Detter et al. . |
| 5,040,097 | 8/1991 | Stribel . |
| 5,040,168 | 8/1991 | Maue et al. . |
| 5,057,026 | 10/1991 | Sawai et al. . |
| 5,084,124 | 1/1992 | Taniguchi . |

(List continued on next page.)

FOREIGN PATENT DOCUMENTS

| | | |
|---|---|---|
| 0209072 | 1/1987 | European Pat. Off. . |
| 0240453 | 10/1987 | European Pat. Off. . |
| 0248181A1 | 12/1987 | European Pat. Off. . |
| 0387772A1 | 9/1990 | European Pat. Off. . |
| 0567403A1 | 10/1993 | European Pat. Off. . |
| 0572052A1 | 12/1993 | European Pat. Off. . |
| 2502887 | 3/1982 | France . |
| 924968 | 3/1955 | Germany ............................ 439/34 |
| 2409660 | 9/1975 | Germany . |
| 3048451 | 7/1982 | Germany . |
| 3732087C1 | 12/1988 | Germany . |
| 3824857A1 | 2/1989 | Germany . |
| 3906667 | 9/1989 | Germany . |
| 4028504 | 3/1991 | Germany . |
| 3936906 | 5/1991 | Germany . |
| 1418031 | 12/1975 | United Kingdom ................. 439/34 |

*Primary Examiner*—Neil Abrams
*Attorney, Agent, or Firm*—Harness, Dickey & Pierce, P.L.C.

[57] ABSTRACT

A power distribution box extends through a bulkhead of an automotive vehicle. This power distribution box has a first electrical connector accessible from within an engine compartment. Furthermore, a portion of the power distribution box is accessible from the passenger compartment. In another aspect of the present invention, an electricity storage device, an electricity generating device, an ignition switch, an alternator and various other engine compartment and passenger compartment accessories are electrically connected to the power distribution box.

30 Claims, 15 Drawing Sheets

U.S. PATENT DOCUMENTS

| | | |
|---|---|---|
| 5,107,404 | 4/1992 | Tam . |
| 5,154,647 | 10/1992 | Ishitani et al. . |
| 5,160,274 | 11/1992 | Ozaki et al. . |
| 5,207,591 | 5/1993 | Ozaki et al. . |
| 5,208,734 | 5/1993 | Sumeno . |
| 5,227,955 | 7/1993 | LeBris et al. ............................ 361/395 |
| 5,285,010 | 2/1994 | Huber . |
| 5,353,190 | 10/1994 | Nakayama et al. ........................ 439/34 |

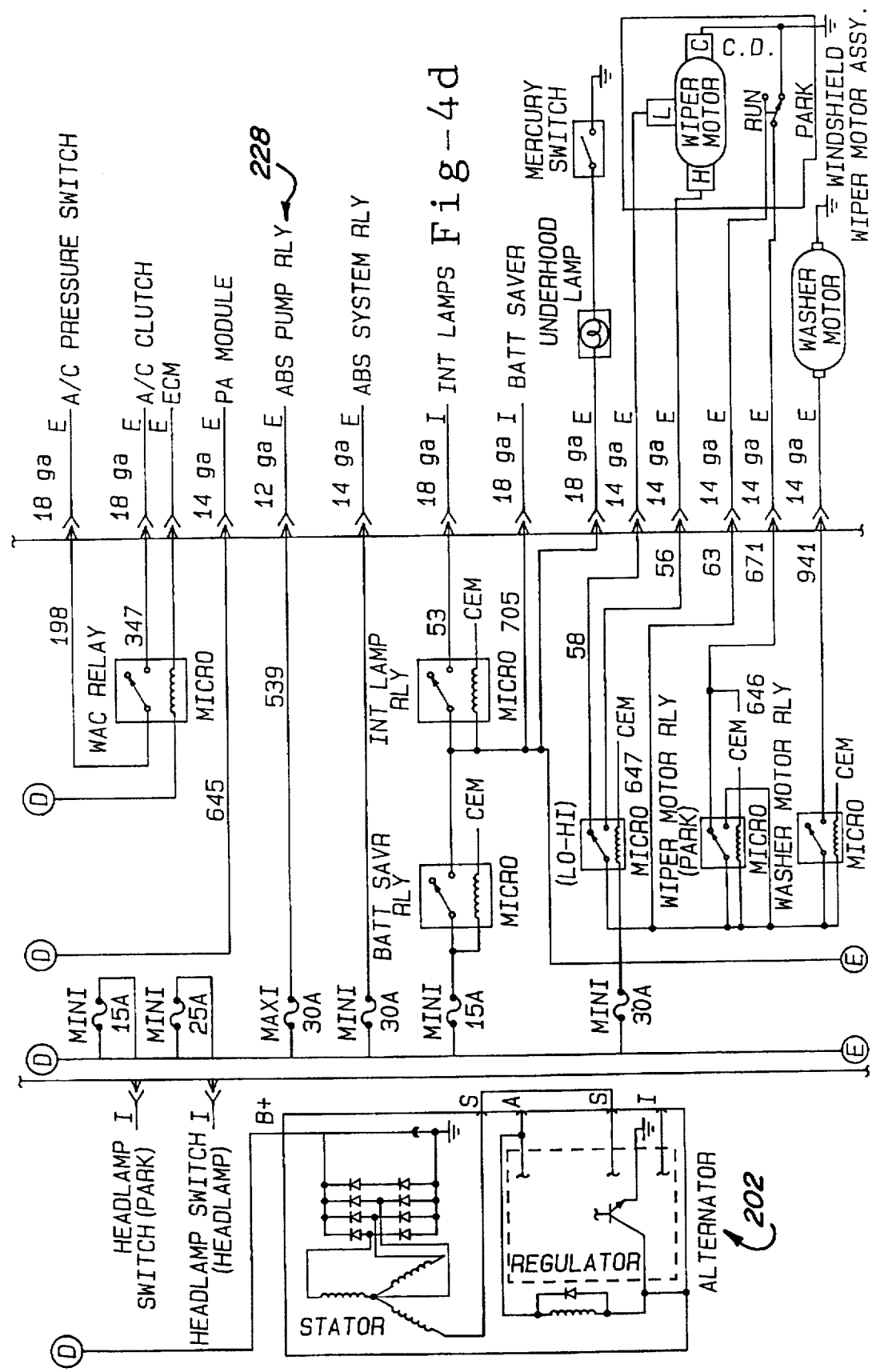

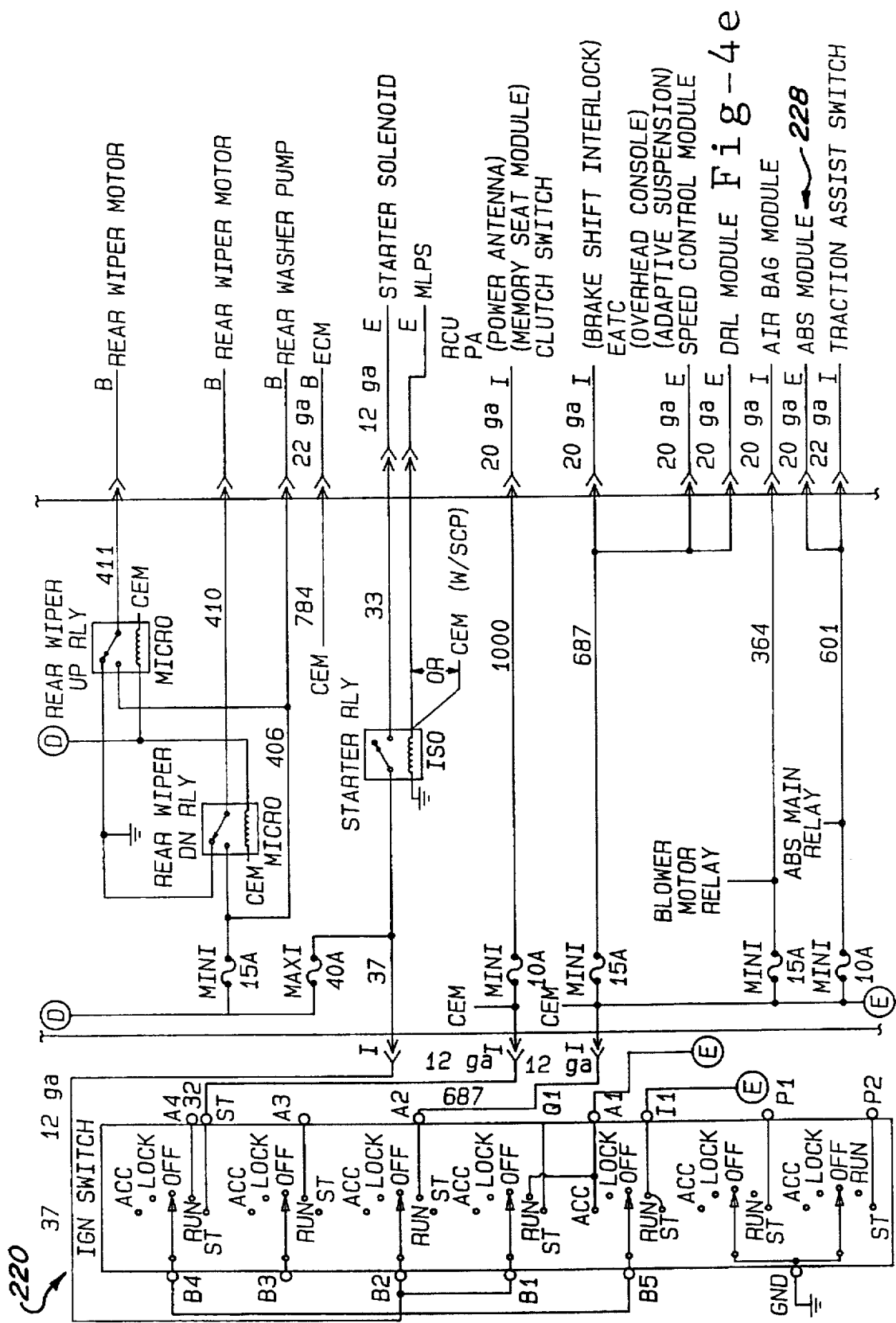

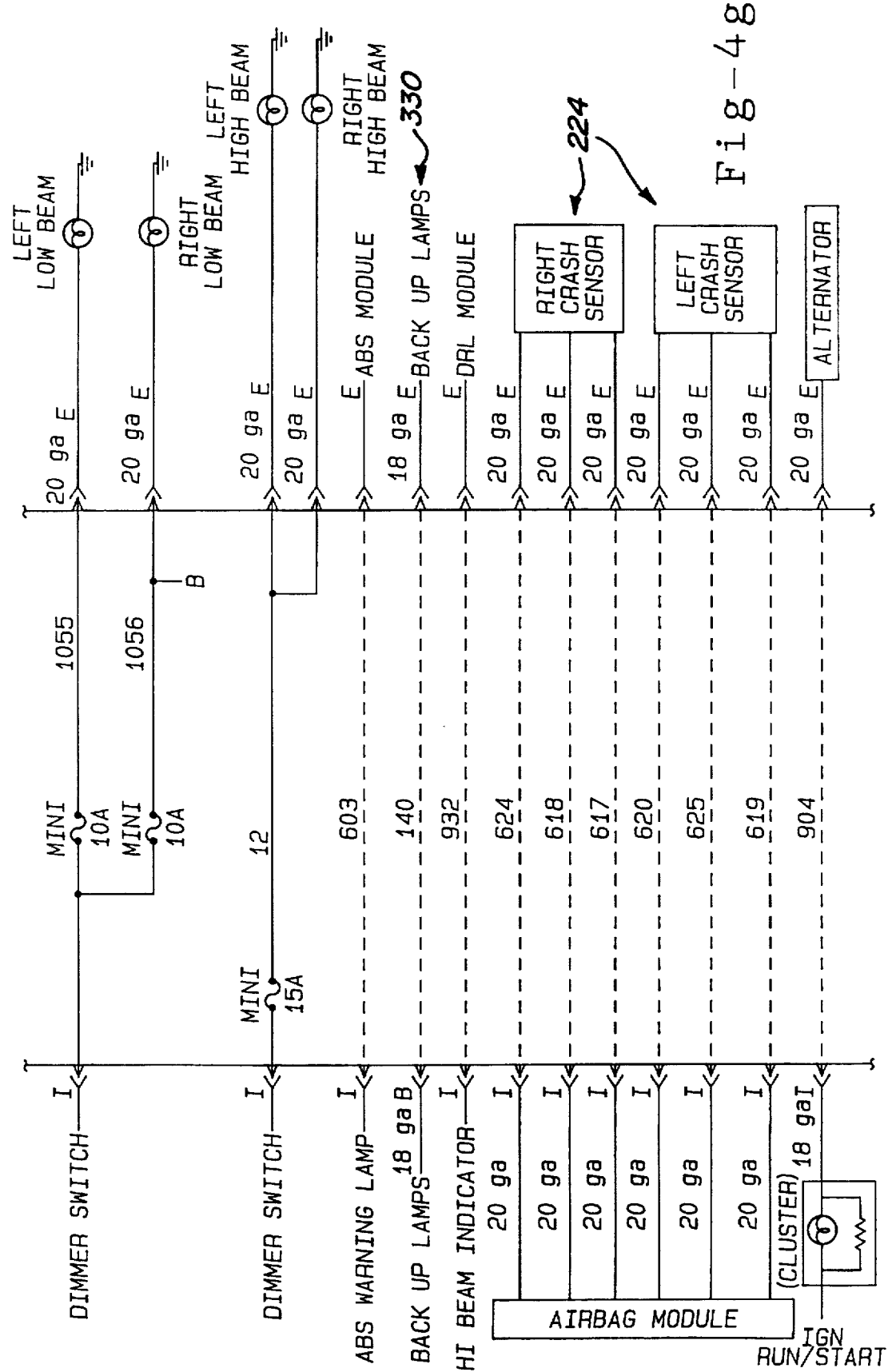

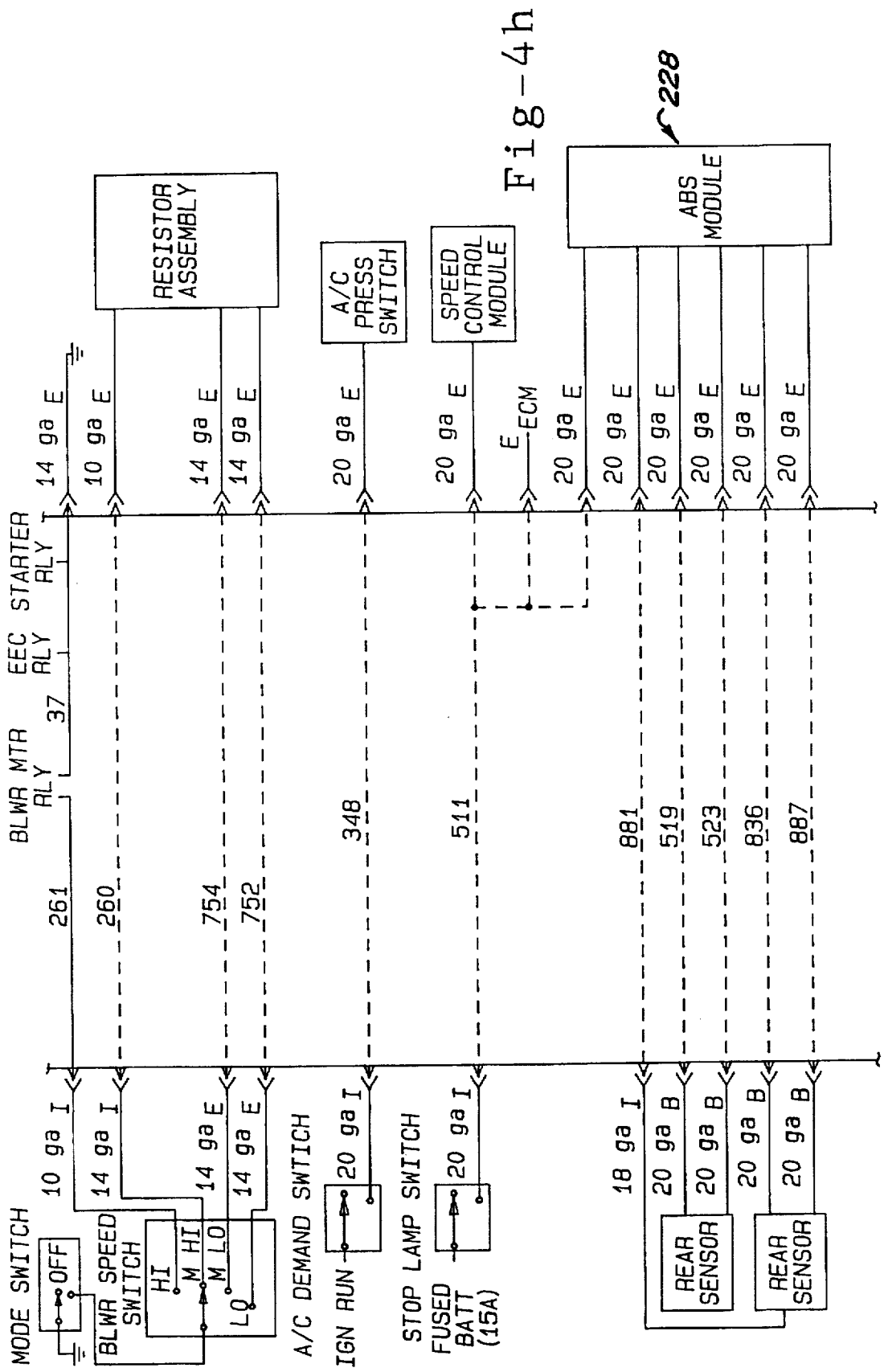

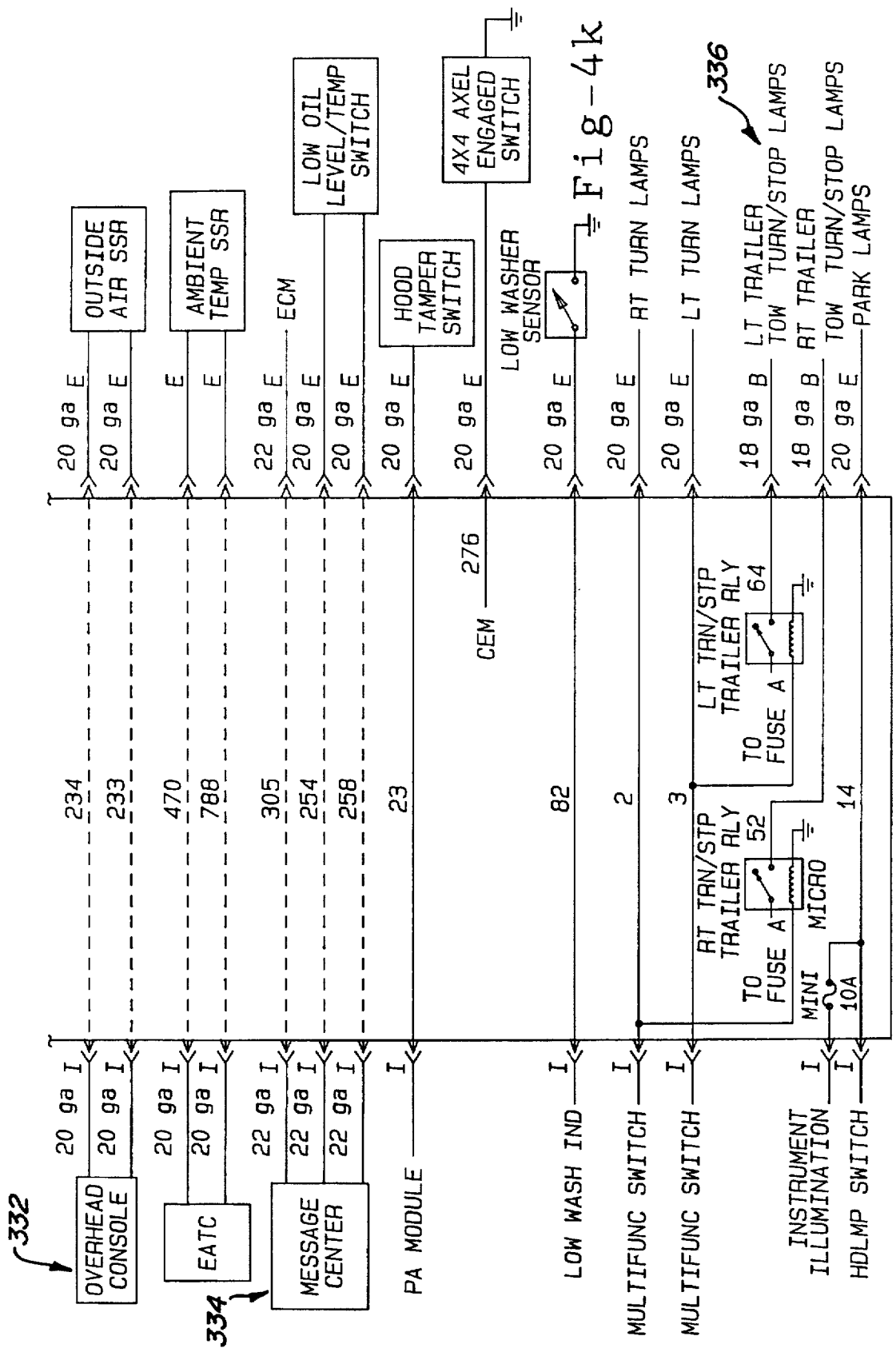

POWER DISTRIBUTION BOX AND SYSTEM

This is a continuation of U.S. patent application Ser. No. 264,796, filed Jun. 23, 1994, now abandoned, which is a Continuation-In-Part of U.S. patent application Ser. No. 08/073,899 filed Jun. 9, 1993, now abandoned.

BACKGROUND OF THE INVENTION

This invention relates generally to power distribution systems and specifically to a power distribution box used in an automotive vehicle power distribution system.

Due to the ever-increasing electrical content present within recent automotive vehicles, the electrical power distribution system within these vehicles has become quite complex. Accordingly, power distribution boxes, otherwise known as junction boxes, have been commonly employed within many of these vehicles. Traditional power distribution boxes have an internal construction consisting of either alternating layers of busbars and insulators, or rigid printed circuit boards. External wire harnesses and electronic modules are typically connected to various of the conductive members.

Examples of conventional power distribution boxes are disclosed within the following U.S. Pat. Nos.: 5,160,274 entitled "Branch Junction Box and Busbars for Branch Connection," which issued to Ozaki et al. on Nov. 3, 1992; 5,154,647 entitled "Electrical Junction Block for Automobile and A Method for Manufacturing the Same," which issued to Ishitani et al. on Oct. 13, 1992; 5,057,026 entitled "Electric Junction Box," which issued to Sawai et al. on Oct. 15, 1991; 5,023,752 entitled "Electrical Power Distribution Center," which issued to Detter et al. on Jun. 11, 1991; 4,689,718 entitled "Programmable Junction Box," which issued to Maue et al. on Aug. 25, 1987; and, 4,355,853 entitled "Electrical Junction Box," which issued to Kourimsky on Oct. 26, 1982.

Conventional power distribution boxes are located in either an engine compartment or a passenger compartment of an automotive vehicle. A bulkhead separates the engine compartment from the passenger compartments. In many vehicles, a first power distribution box is located within an engine compartment and a second power distribution box is positioned inside an instrument panel in a passenger compartment. These power distribution systems require a jumper harness between a battery and the engine compartment power distribution box, another wire harness extending between the engine compartment power distribution box and a bulkhead connector located at a bulkhead panel, a wire harness between the engine compartment power distribution box and various engine compartment components, yet another wire harness between the bulkhead connector and a passenger compartment fuse block, and either another wire harness or a spliced branch extending to a passenger compartment relay block. In some traditional constructions, the passenger compartment fuse block and relay block may be supplemented by or integrated into another power distribution box located within the passenger compartment.

Furthermore, various German automotive vehicles employ a pair of substantially parallel crosscar bulkheads juxtapositioned within an engine compartment, the rearmost of these bulkheads separates the engine compartment and the passenger compartment. In this construction, a junction box and a battery are located between the pair of bulkheads. However, numerous jumper wire harnesses must be employed with bulkhead connectors therebetween to supply power to both the engine and passenger compartments. It is significant to note that the many redundant wire harnesses, jumper wire harnesses, connectors, splices and bulkhead gaskets employed in the aforementioned conventional power distribution systems are costly to produce and assemble, failure prone and cumbersome to package.

Traditional power distribution systems also have a direct electrical feed or wire from the battery and alternator to a power distribution box and a second direct electrical feed from the battery and alternator to an ignition switch. Furthermore, conventional power distribution systems provide a maxi fuse between a battery and a power distribution box. The maxi fuse protects the heavy wire gauge that feeds the power distribution box fuses.

SUMMARY OF THE INVENTION

In accordance with the present invention, the preferred embodiment of a power distribution box extends through a bulkhead of an automotive vehicle. The power distribution box has a first electrical connector accessible from within an engine compartment. In another aspect of the present invention, the power distribution box has a second electrical connector accessible from within a passenger compartment of the automotive vehicle. In a further aspect of the present invention power distribution system, an electricity storage device and an electricity generating device are directly electrically coupled to a power distribution box which, in turn, supplies power to an ignition switch. In yet another aspect of the present invention power distribution system, an electricity storage device directly supplies power to a power distribution box without a fuse being positioned therebetween.

The power distribution box and system of the present invention have many advantages over conventional constructions. For example, the power distribution system of the present invention reduces the need for bulkhead connectors. The power distribution box of the present invention further reduces the number of wiring harnesses, jumper harnesses and splices therein. Thus, significantly improved electrical continuity and quality are achieved. The present invention power distribution box is also advantageous over traditional systems by integrating the many remotely located junction, relay, fuse, connector and sealing functions into a single integrated and easily accessible location. This improves cost, assembly, service, packaging and quality. Additional advantages and features of the present invention will become apparent from the following description and the appended claims, taken in conjunction with the accompanying drawings.

BRIEF DESCRIPTION OF THE DRAWINGS

FIGS. 4a–4k are a circuit diagram of the preferred embodiment power distribution system within which the preferred embodiment of the present invention power distribution box of FIG. 1 is employed.

DETAILED DESCRIPTION OF THE PREFERRED EMBODIMENT

Figure 1:
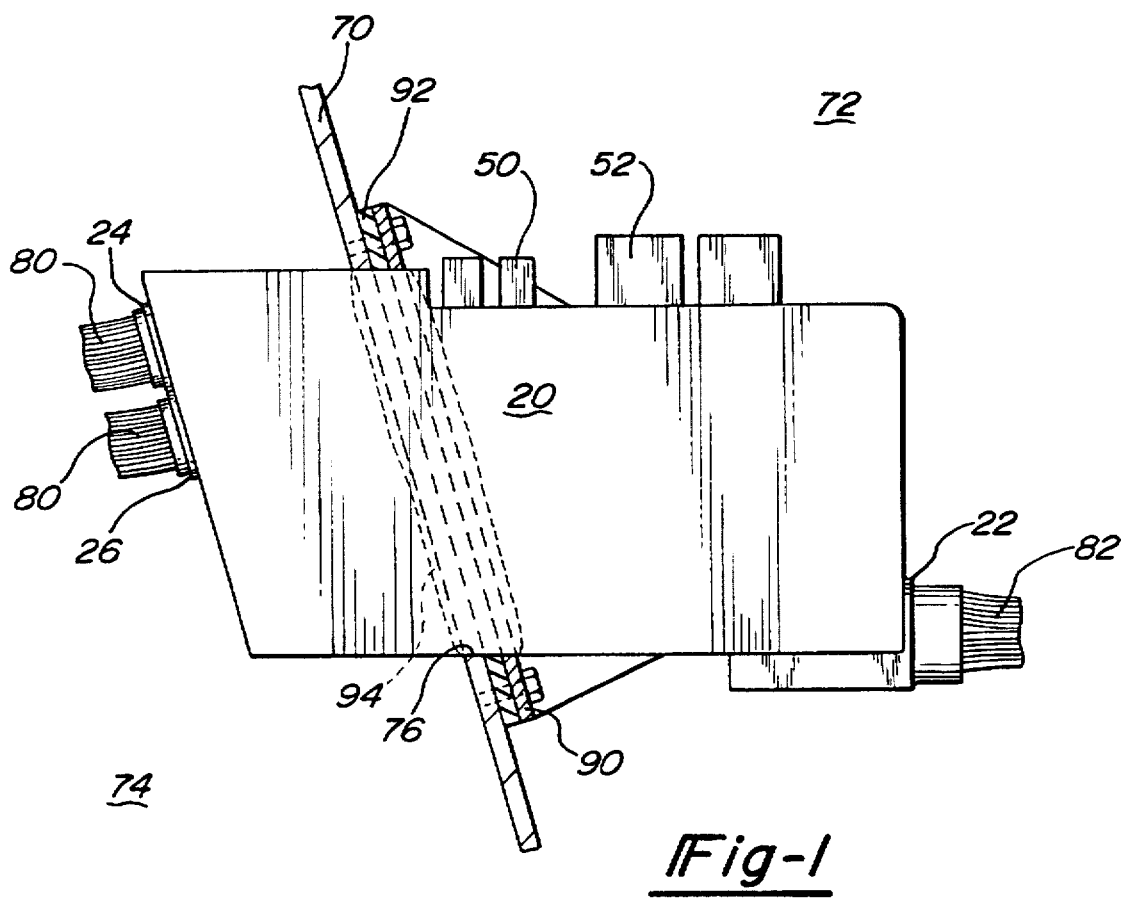
FIG. 1 is a side elevational view, partially in section, showing a preferred embodiment of a power distribution box and system of the present invention in relation to a bulkhead.
Figure 2:
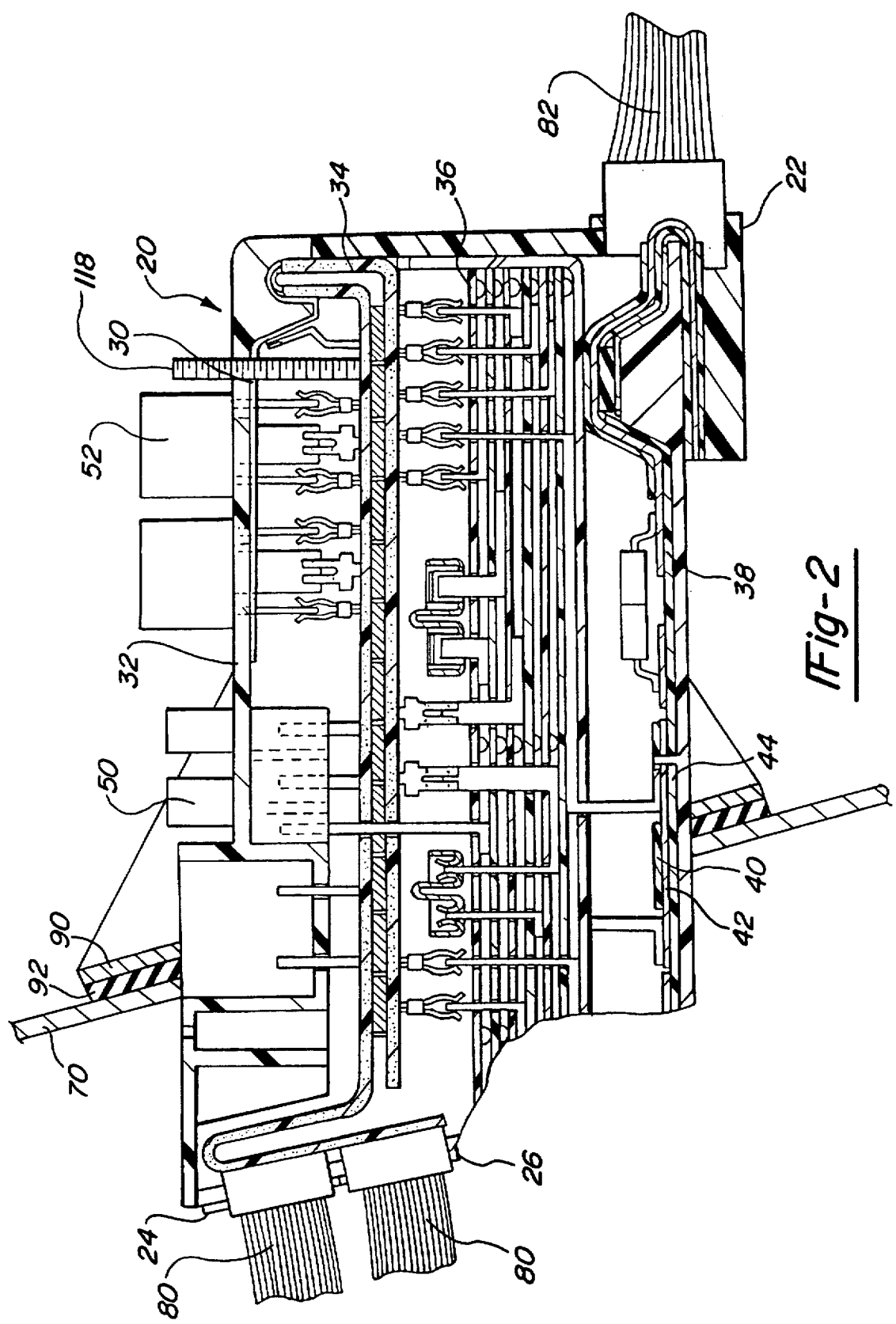
FIG. 2 is a fore and aft sectional view showing the preferred embodiment of the present invention power distribution box and system of FIG. 1.

A preferred embodiment of a power distribution system of the present invention is shown in FIGS. 1 and 2. The power distribution system employs a power distribution box 20 having a first electrical connector 22, a second electrical connector 24 and a third electrical connector 26. Power distribution box 20 includes a conductive deposited metal trace 30 secured to a hingeable cover 32, a rigid printed circuit board 34, a busbar and insulator assembly 36 and a flexible printed circuit board 38. Flexible printed circuit board 38 is defined by a first film sheet 40, a conductive metallic layer 42, and a second film sheet 44. A plurality of maxi fuses 50 of approximately 30 to 80 amps, mini fuses (also shown as 50) of approximately 3 to 30 amps, ISO relays 52 and half ISO relays (also shown as 52) are attached to cover 32 and electrically coupled to at least one of the internal electrically conductive means (30, 34, 36 and 38).

The automotive vehicle has a bulkhead 70 which structurally separates an engine compartment 72 from a passenger compartment 74. Bulkhead 70 has an inside edge 76, defining an aperture therethrough. Power distribution box 20 is juxtaposed against bulkhead 70, such that a portion of power distribution box 20 extends within passenger compartment 74 and is accessible therefrom. Thus, a pair of body wire harnesses 80 are electrically coupled to power distribution box connectors 24 and 26. Power distribution box 20 further has a portion thereof projecting within engine compartment 72 such that an engine wire harness 82 is electrically coupled with power distribution box connector 22. Moreover, fuses 50 and relays 52 are accessible and serviceable from within engine compartment 72. In the alternative, fuses 50 and relays 52 may be positioned upon or within power distribution box 20, so as to be accessible from passenger compartment 74.

Power distribution box 20 has a flange 90 formed therearound so as to provide a mounting surface for attachment to the engine compartment side of bulkhead 70. A closed cell foam seal 92 is located between flange 90 and fire wall 70 proximate with inside edge 76 of bulkhead 70. Additionally, a gel sealant material 94, which can be purchased from Raychem®, is pumped into power distribution box 20. Seals 92 and 94 act to reduce engine noise, dust intrusion, and fumes from passing between engine compartment 72 and passenger compartment 74.

Figure 3:
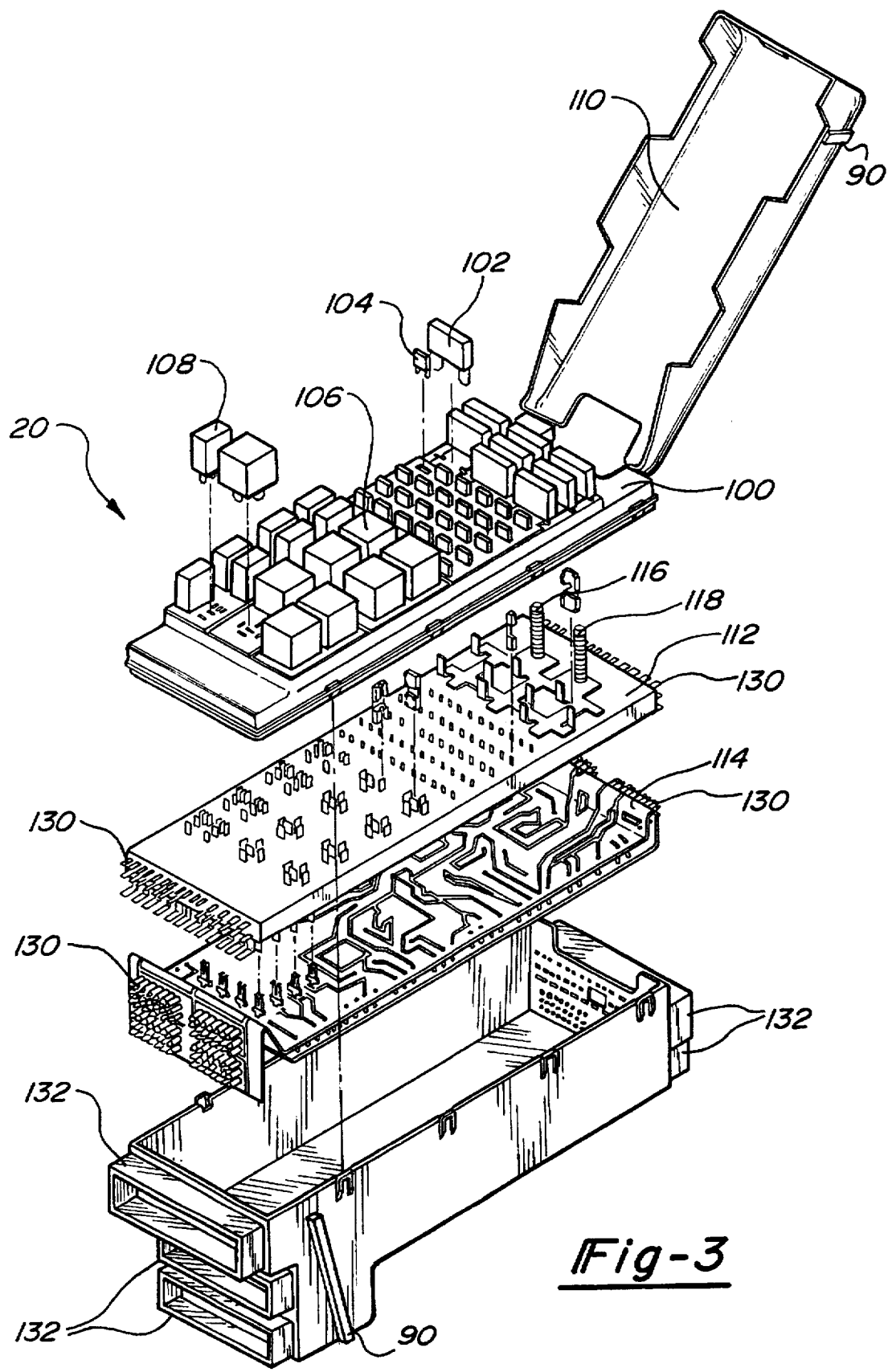
FIG. 3 is an exploded perspective view showing an alternate embodiment of the present invention power distribution box of FIG. 1.
Figure 4A:
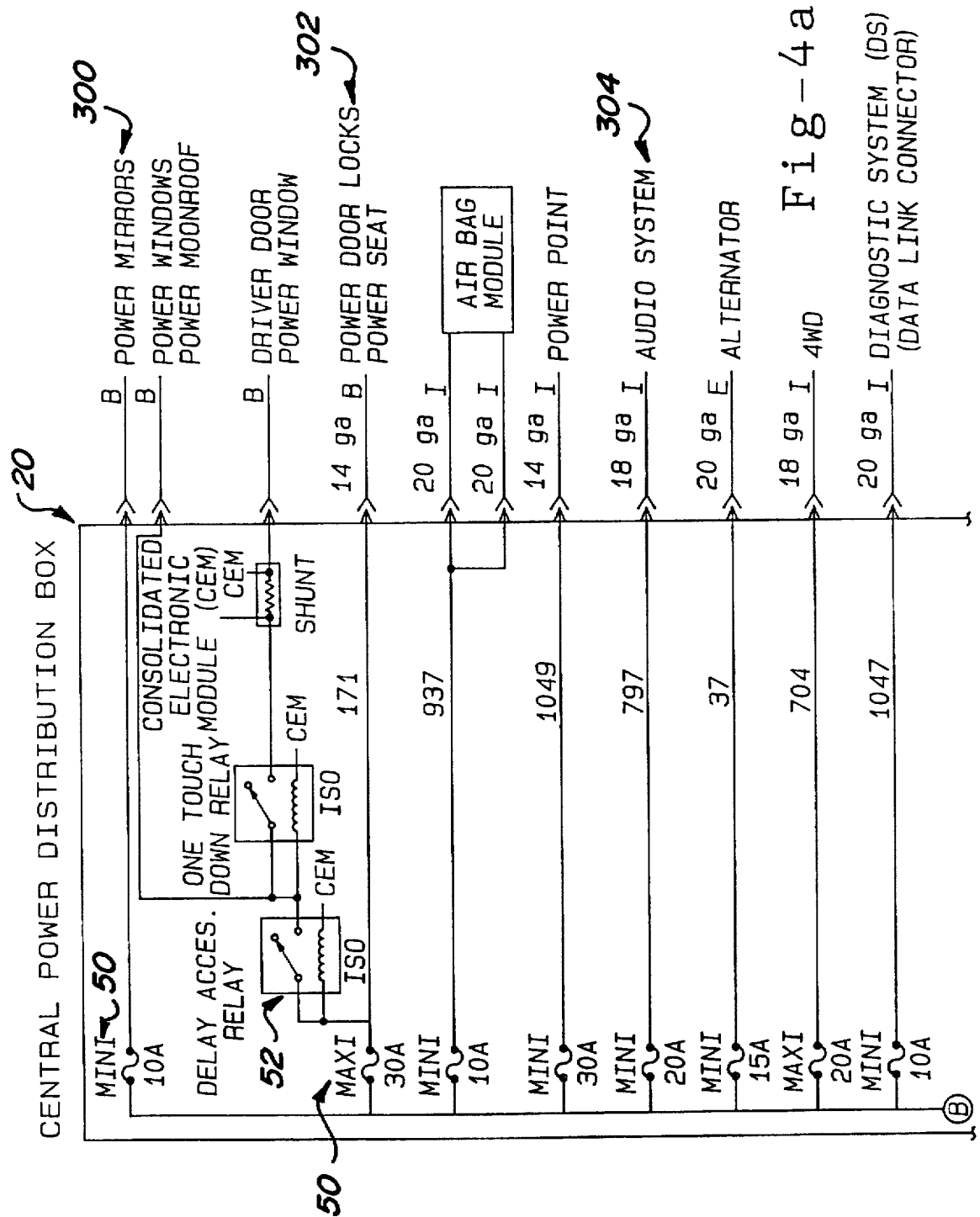
Figure 4B:
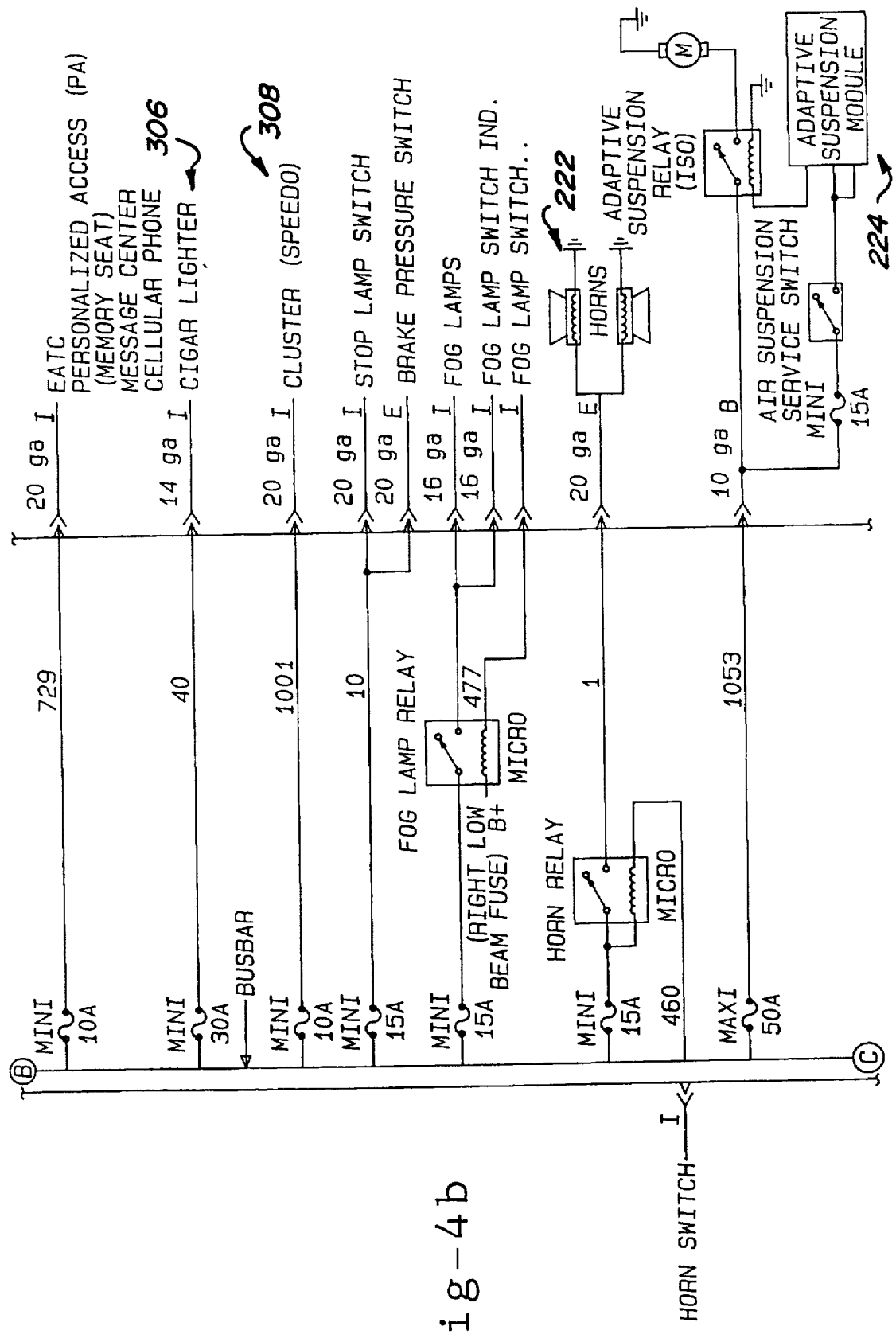
Figure 4C:
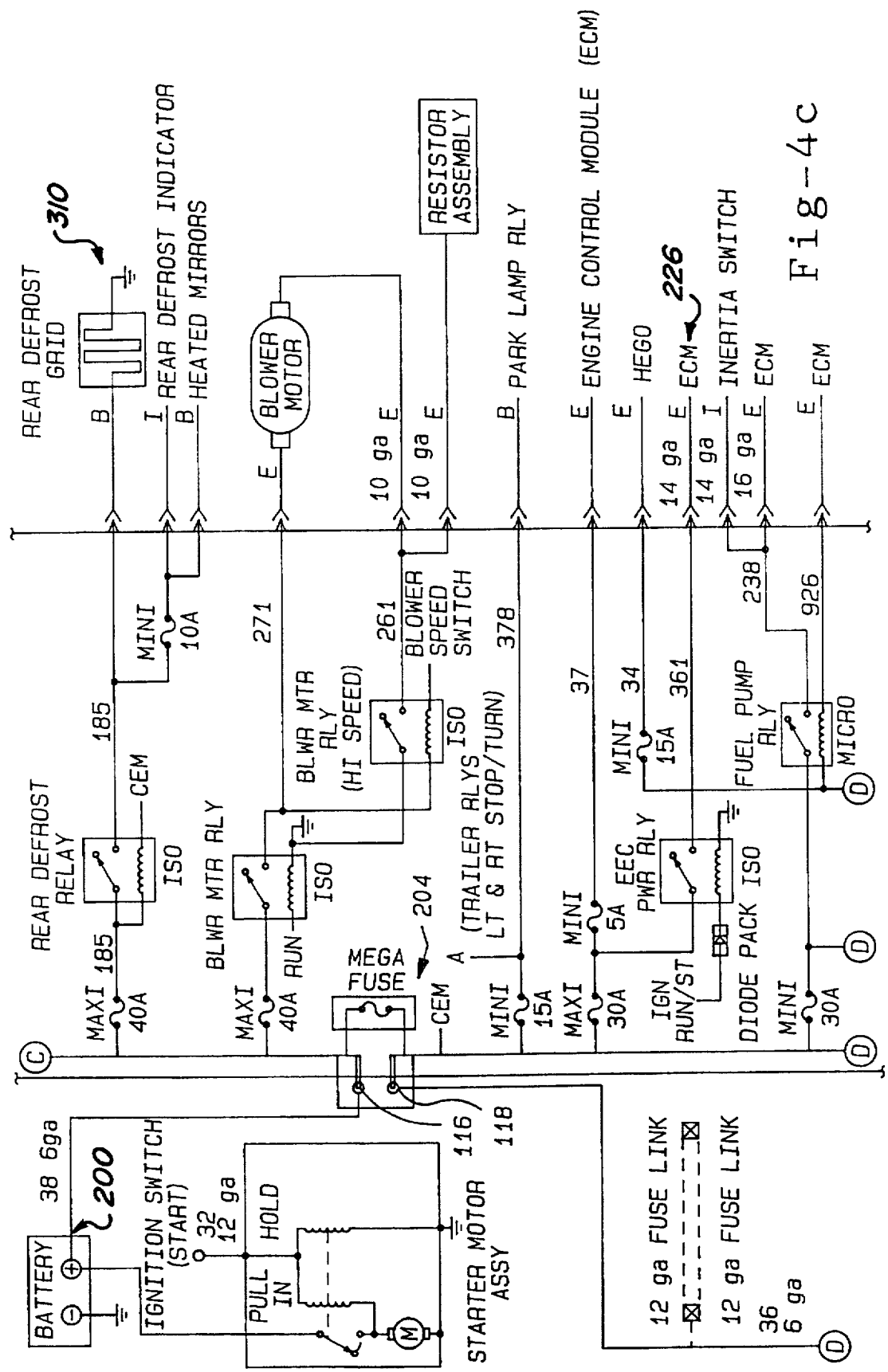
Figure 4F:
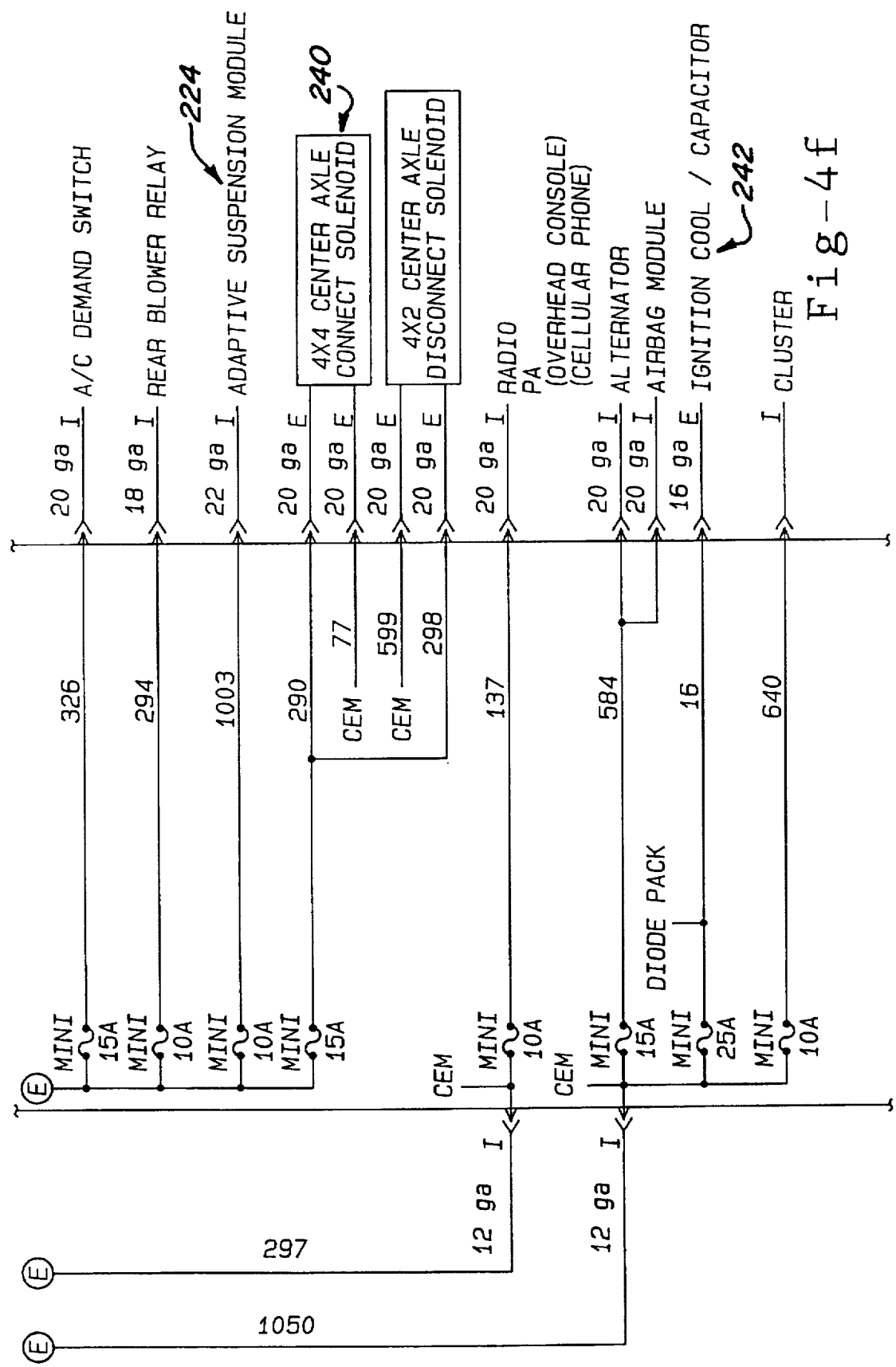
Figure 4I:
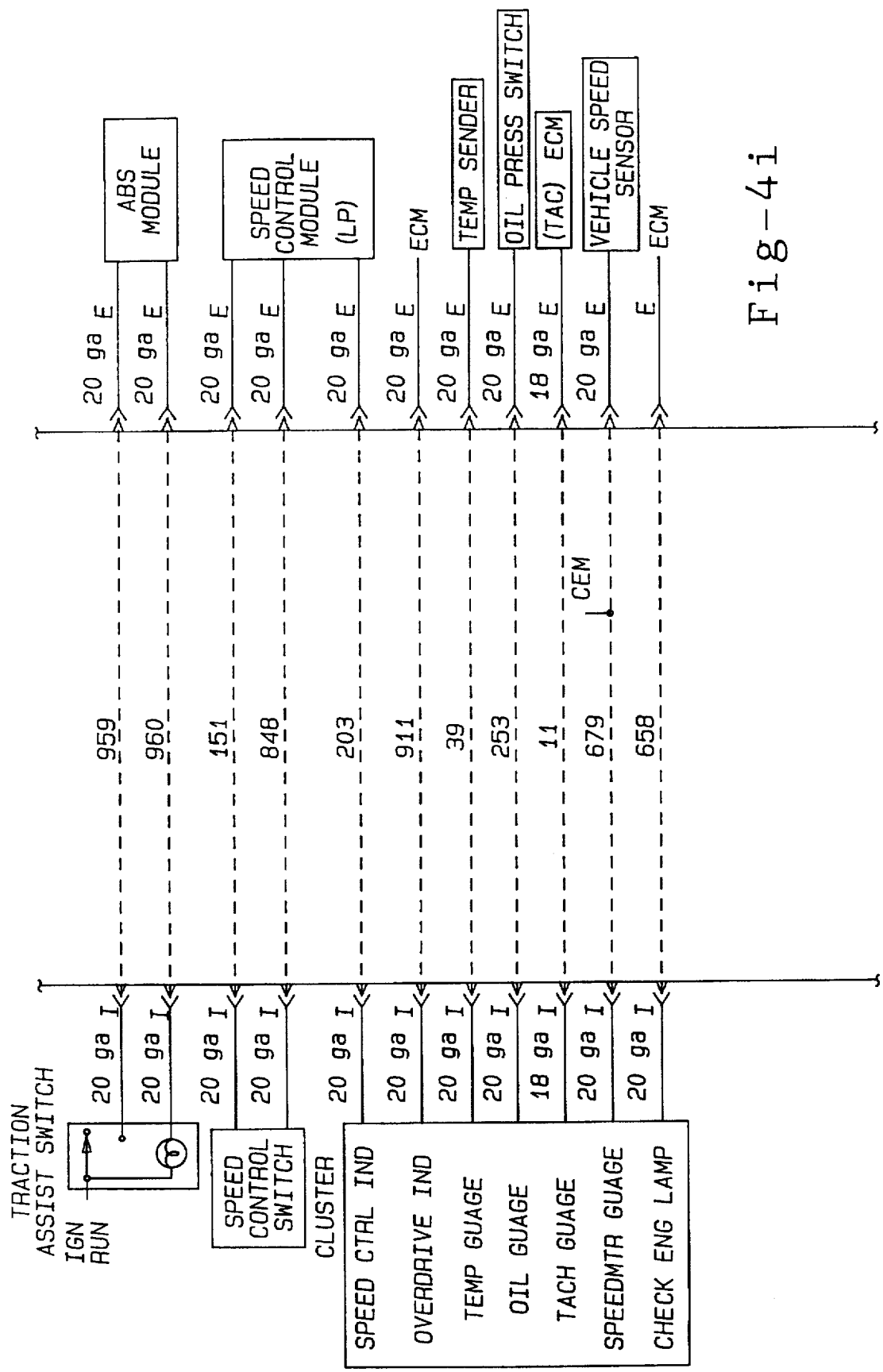
Figure 4J:
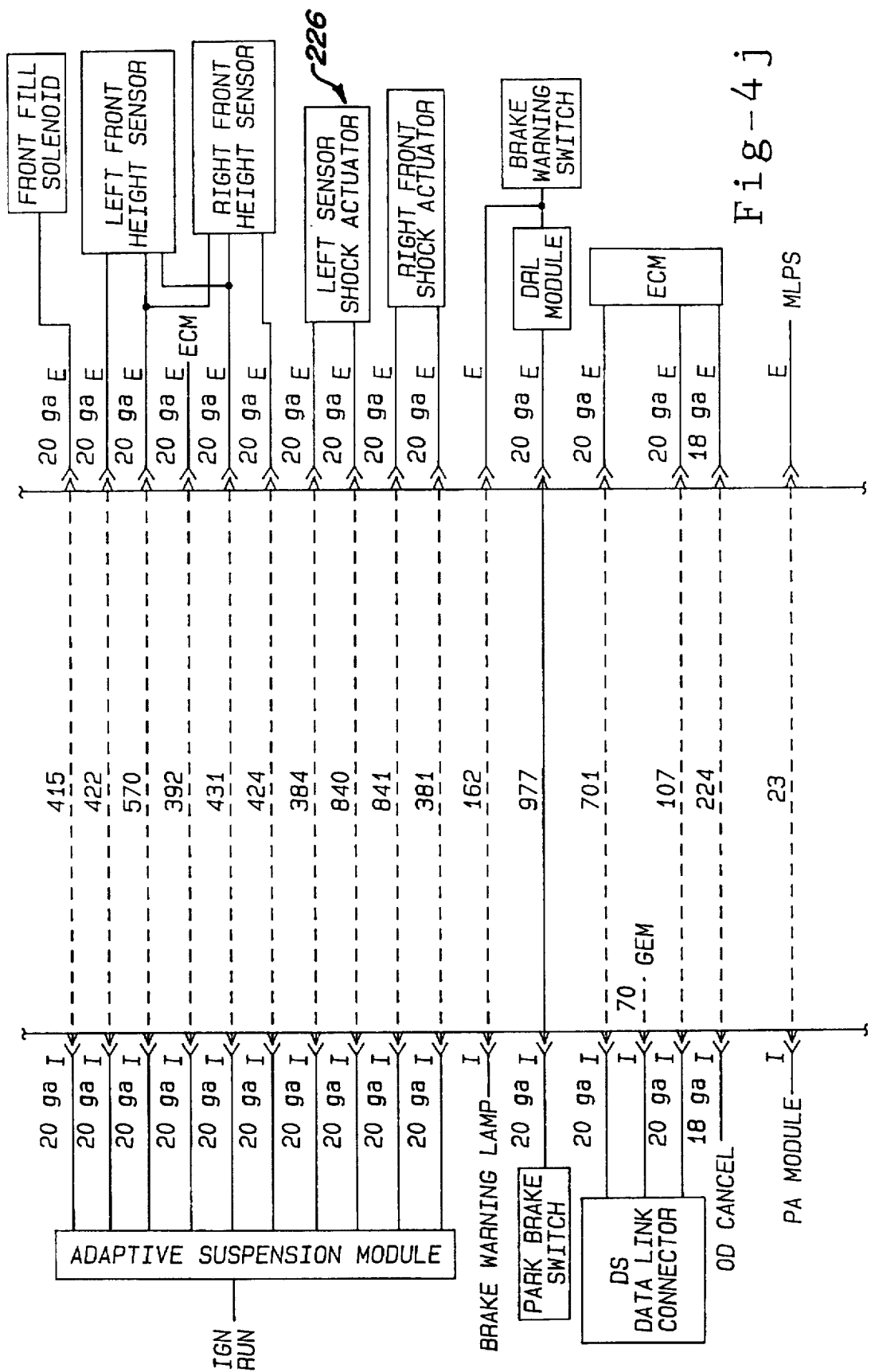
Figure 5:
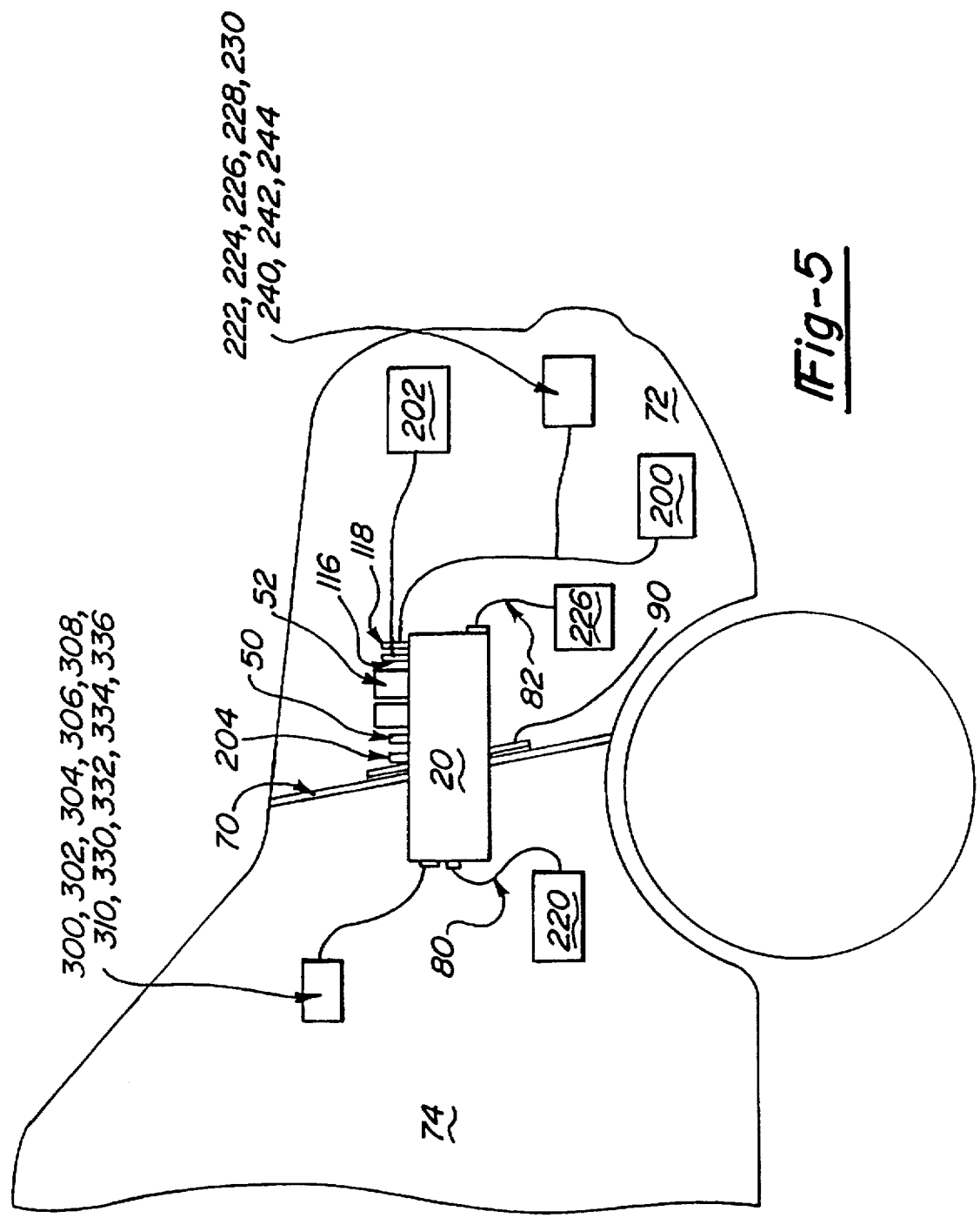
FIG. 5 is a schematic diagram showing the power distribution system within which the preferred embodiment of the present invention power distribution box of FIG. 1 is employed.

An alternate embodiment power distribution box 20 of the present invention is shown in FIG. 3. This embodiment provides a shelf 100 which retains a plurality of maxi fuses 102, mini fuses 104, ISO relays 106, and half ISO relays 108. This shelf 100 is enclosed within a hingeable cover 110. Also, within power distribution box 20 of this embodiment are electrically conductive means including a busbar and insulator assembly 112 and a rigid printed circuit board 114. A battery terminal or stud 116 and an alternator terminal or stud 118 project from busbar and insulator assembly 112 for connection to a battery and alternator, respectively, via jumper cable feeds. A plurality of male blades or pins 130 project from the edges of busbar and insulator assembly 112 and rigid printed circuit board 114 for providing the electrical coupling means within their respective power distribution box electrical connectors 132.

Referring FIGS. 1, 4a–4k and 5, an electricity storage device or battery 200 is directly electrically coupled to terminal 116 of power distribution box 20 without a fuse being located therebetween. An electricity generating device or alternator 202 is electrically coupled to terminal 118 of power distribution box 20. A mega fuse 204 is connected between terminal 116 and terminal 118 within power distribution box 20. This allows fuse 204 to be more easily serviced over traditional constructions. Power distribution box 20 then distributes electrical power through various fuses 50, relays 52 and any other electronics contained therein. The electrical power is then distributed and transmitted to engine wire harness 82 which electrically feeds various engine compartment components including an ignition switch 220, horns 222, an adaptive suspension module 224, an electronic engine control module 226, an anti-lock braking system pump relay 228, a windshield wiper assembly 230, transmission connection solenoids 240, ignition coils 242, crash sensors 244, and shock sensor actuators 226. Electrical power is also fed through power distribution box 20 and, in turn, body wire harnesses 80, to various passenger compartment components including power mirrors 300, power door locks 302, an audio system 304, a cigar lighter 306, an instrument panel cluster 308, a rear defrost grid 310, backup lamps 330, overhead consoles 332, instrument panel message centers 334, and trailer towing lamps 336.

The present invention power distribution box and system provide many advantages over prior art constructions. The present invention power distribution box is positioned to extend through the bulkhead so as to have portions thereof accessible from the engine compartment and other portions thereof accessible from the passenger compartment. This eliminates the traditional extraneous jumper wire harnesses (each having over 100 discrete wires therein), expensive bulkhead connectors and bulkhead seals. The power distribution box of the present invention allows for use of modularized wire harnesses that can be simply attached to the power distribution box electrical connectors. This power distribution box further eliminates separate relay blocks, fuse blocks and supplemental power distribution boxes located on both sides of the bulkhead. Thus, the present invention can be produced and assembled at a lower cost, with fewer parts, that is more reliable, and in a centralized fashion for promoting ease of service. The present invention further simplifies the power distribution system architecture over traditional redundant constructions.

While the preferred embodiment of this power distribution box and system have disclosed, it will be appreciated that various modifications may be made without departing from the present invention. For example, the power distribution box may only include a busbar and insulator assembly or any combination of the electrically conductive means therein. Furthermore, the power distribution box may be mounted from within the passenger compartment. An electronic module may also be integrated or attached to the power distribution box. Moreover, the novel circuitry regarding the ignition switch feed and battery fusing may be employed in a power distribution box which does not pass through the bulkhead. Various materials and circuits have been disclosed in exemplary fashion, however, other materials and circuitry may of course be employed. It is intended by the following claims to cover these and any other departures from the disclosed embodiments which fall within the true spirit of this invention.

The invention claimed is:

1. In combination, a power distribution box and an automotive vehicle, said combination comprising:
    a substantially nonconductive housing of said power distribution box having a substantially box-like configuration with a bottom wall and side walls;
    at least partially flat, alternating busbar and insulator layers located in said power distribution box for distributing electrical power;

a bulkhead separating an engine compartment and a passenger compartment within said automotive vehicle, said housing being mountable to said bulkhead solely from one of said compartments;

an edge of said bulkhead defining an aperture; and unbroken and continuous portions of said housing and said alternating busbar and insulator layers at least partially disposed through said aperture of said bulkhead, said alternating busbar and insulator layers extending substantially transversely through said bulkhead aperture, first portions of said housing and said electrical conductive means being accessible from said engine compartment and second portions of said housing and said electrical conductive means being accessible from said passenger compartment, said alternating busbar and insulator layers including branched circuits.

2. The combination of claim 1 wherein said power distribution box is secured to said bulkhead.

3. The combination of claim 2 further comprising a seal juxtaposed between said power distribution box and said bulkhead proximate with said aperture.

4. The combination of claim 3 further comprising a sealing material disposed within said power distribution box to reduce noise from entering said passenger compartment from said engine compartment.

5. The combination of claim 1 wherein said power distribution box includes a first electrical connector accessible from said engine compartment.

6. The combination of claim 5 further comprising an engine wire harness electrically coupled to said first electrical connector of said power distribution box.

7. The combination of claim 5 wherein said first electrical connector of said power distribution box includes a plurality of conductive metal blades projecting from and electrically coupled to said electrically conductive means.

8. The combination of claim 1 wherein said power distribution box includes a second electrical connector accessible from said passenger compartment.

9. The combination of claim 8 comprising a body wire harness electrically coupled to said second electrical connector of said power distribution box.

10. The combination of claim 8 wherein said second electrical connector of said power distribution box includes a plurality of conductive metal blades projecting from and electrically coupled to said electrically conductive means.

11. The combination of claim 1 further comprising:

an electricity storage device; and a terminal of said power distribution box electrically coupled to said electricity storage device, said terminal accessible from said engine compartment.

12. The combination of claim 1 further comprising:

an electricity generating device;

a terminal of said power distribution box electrically coupled to said electricity generating device, said terminal accessible from said engine compartment.

13. The combination of claim 1 further comprising at least four alternating busbar and insulator layers located in said housing.

14. The combination of claim 1 further comprising at least one conductive deposited metal trace located in said housing.

15. The combination of claim 1 further comprising a rigid printed circuit board located in said housing.

16. The combination of claim 1 further comprising a flexible printed circuit board defined by a first film sheet and a second film sheet with a conductive layer located substantially therebetween, said flexible printed circuit board being located in said housing.

17. The combination of claim 1 further comprising additional electrically conductive means located in said power distribution box, a plurality of fuses electrically coupled to said electrically conductive means and accessible from said engine compartment.

18. The combination of claim 1 further comprising additional electrically conductive means located in said power distribution box, a plurality of relays electrically coupled to said electrically conductive means and accessible from said engine compartment.

19. In an automotive vehicle having a bulkhead separating a passenger compartment and a second compartment disposed adjacent to said passenger compartment, a power distribution box including:

electrically conductive means for distributing electrical power including a busbar and insulator assembly, at least a majority portion of said busbar and insulator assembly being oriented in a substantially flat layer, said busbar and insulator assembly including interconnected busbars disposed within said power distribution box;

a single housing of said power distribution box and said busbar and insulator assembly internally disposed therein being at least partially disposed through an aperture of said bulkhead in a substantially horizontal manner;

a first electrical connector accessible from said second compartments second and third electrical connectors accessible from said passenger compartment;

a first wire harness electrically coupleable to said first electrical connector of said power distribution box;

body wire harnesses electrically coupleable to said second electrical connector of said power distribution box;

a plurality of electronic components electrically coupled to said electrically conductive means and accessible from said second compartment;

a first terminal and a second terminal of said power distribution box: and an electricity storage device electrically coupleable to said first terminal of said power distribution box without a fuse therebetween, said first and second terminals accessible from said second compartment.

20. An apparatus installed in an automotive vehicle having a bulkhead, a single first compartment and a second compartment, said apparatus comprising:

unitary power distribution box having a single elongated housing and a cover;

an electrically conductive layer for distributing electrical power by way of interconnected and branched circuits internally disposed within a cavity defined between said housing and said cover;

said housing being installed through said bulkhead from said single first compartment of said automotive vehicle and being attached to said bulkhead from said single first compartment;

a first wire harness electrical connector directly connected to a first electrical connector of said power distribution box from said second compartment of said automotive vehicle;

a second wire harness electrical connector connected to a second electrical connector of said power distribution box from said first compartment;

a sealing surface of said power distribution box substantially sealing against said bulkhead longitudinally between said first and second electrical connectors, said sealing surface outwardly depending substantially perpendicular to the length of said power distribution box;

said electrically conductive layer extending substantially transversely through an aperture in said bulkhead; and a fuse mounted to said power distribution box.

21. The apparatus of claim 20 further comprising:

a flange outwardly projecting from said housing, said flange terminating at a distal edge;

a fastener affixing said flange to said bulkhead; and a seal disposed between said flange and said bulkhead.

22. The apparatus of claim 21 further comprising a gel sealant disposed inside said power distribution box, said first compartment being defined as an engine compartment.

23. The power distribution box of claim 20 wherein said electrically conductive layer is electrically accessible through apertures within ends of said housing.

24. The power distribution box of claim 23 wherein a first of said ends of said housing is disposed in said first compartment which is an engine compartment of said automotive vehicle.

25. The power distribution box of claim 24 wherein a second of said ends of said housing is disposed in said second compartment which is a passenger compartment of said automotive vehicle.

26. The power distribution box of claim 25 further comprising a preformed and resilient seal disposed between said housing and said bulkhead said bulkhead separating said compartments.

27. The power distribution box of claim 20 wherein said electrically conductive layer includes at least one busbar and insulator assembly.

28. The power distribution box of claim 20 wherein said electrically conductive layer includes at least one conductive deposited metal trace.

29. The power distribution box of claim 20 wherein said electrically conductive layer includes a rigid printed circuit board.

30. The power distribution box of claim 20 wherein said electrically conductive layer includes a flexible printed circuit board.

* * * * *